(12) United States Patent
de la Llera et al.

(10) Patent No.: US 8,470,127 B2
(45) Date of Patent: *Jun. 25, 2013

(54) CAM-LOCKED SHOWERHEAD ELECTRODE AND ASSEMBLY

(75) Inventors: Anthony de la Llera, Fremont, CA (US); Pratik Mankidy, Fremont, CA (US); Rajlnder Dhindsa, San Jose, CA (US); Michael C. Kellogg, Oakland, CA (US); Gregory R. Bettencourt, Fremont, CA (US); Roger Patrick, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/985,568

(22) Filed: Jan. 6, 2011

(65) Prior Publication Data
US 2012/0175062 A1   Jul. 12, 2012

(51) Int. Cl.
*C23C 16/00* (2006.01)
*H01L 21/00* (2006.01)

(52) U.S. Cl.
USPC .............. 156/345.43; 118/723 E; 118/715

(58) Field of Classification Search
USPC ........... 118/715, 723 E; 156/345.43, 345.44, 156/345.45, 345.46, 345.47
See application file for complete search history.

(56) References Cited

U.S. PATENT DOCUMENTS

| | | | |
|---|---|---|---|
| 4,585,920 A | 4/1986 | Hoog et al. | |
| 4,612,077 A | 9/1986 | Tracy et al. | |
| 4,792,378 A * | 12/1988 | Rose et al. | 438/706 |
| 4,908,095 A | 3/1990 | Kagatsume et al. | |
| 5,074,456 A | 12/1991 | Degner et al. | |
| 5,200,016 A | 4/1993 | Namose | |
| 5,356,515 A | 10/1994 | Tahara et al. | |
| 5,422,139 A * | 6/1995 | Fischer | 427/248.1 |
| 5,423,936 A | 6/1995 | Tomita et al. | |
| D363,464 S | 10/1995 | Fukasawa | |

(Continued)

FOREIGN PATENT DOCUMENTS

| | | |
|---|---|---|
| JP | 07-066180 A | 3/1995 |
| JP | 09-013172 A | 1/1997 |
| JP | 3160877 U | 7/2010 |
| WO | WO2009/114175 A2 | 9/2009 |

OTHER PUBLICATIONS

Commonly owned U.S. Appl. No. 61/036,862, filed Mar. 14, 2008.

(Continued)

*Primary Examiner* — Sylvia R MacArthur
*Assistant Examiner* — Anna Crowell
(74) *Attorney, Agent, or Firm* — Buchanan Ingersoll & Rooney PC

(57) ABSTRACT

A showerhead electrode and assembly useful for plasma etching includes cam locks which provide improved thermal contact between the showerhead electrode and a backing plate. The cam locks include cam shafts in the backing plate which engage enlarged heads of studs mounted on the showerhead electrode. The assembly can include an annular shroud surrounding the showerhead electrode and eight of the cam shafts in the backing plate can be operated such that each cam shaft simultaneously engages a stud on the annular shroud and a stud in an outer row of studs on the showerhead electrode. Another eight cam shafts can be operated such that each cam shaft engages a pair of studs on inner and middle rows of the studs mounted of the showerhead electrode.

9 Claims, 11 Drawing Sheets

U.S. PATENT DOCUMENTS

| | | | |
|---|---|---|---|
| 5,500,256 | A | 3/1996 | Watabe et al. |
| 5,534,751 | A | 7/1996 | Lenz et al. |
| 5,569,356 | A | 10/1996 | Lenz et al. |
| 5,589,002 | A | 12/1996 | Su |
| 5,590,975 | A * | 1/1997 | Horntvedt .................... 403/320 |
| 5,593,540 | A | 1/1997 | Tomita et al. |
| 5,624,498 | A | 4/1997 | Lee et al. |
| 5,746,875 | A | 5/1998 | Maydan et al. |
| 5,766,364 | A | 6/1998 | Ishida et al. |
| 5,792,269 | A | 8/1998 | Deacon et al. |
| D411,516 | S | 6/1999 | Imafuku et al. |
| 5,959,409 | A | 9/1999 | Dornfest et al. |
| 5,993,597 | A | 11/1999 | Saito et al. |
| 5,997,649 | A | 12/1999 | Hillman |
| 6,024,799 | A | 2/2000 | Chen et al. |
| 6,036,782 | A | 3/2000 | Tanaka et al. |
| 6,050,216 | A * | 4/2000 | Szapucki et al. .......... 118/723 E |
| 6,086,710 | A | 7/2000 | Miyashita et al. |
| 6,110,556 | A | 8/2000 | Bang et al. |
| 6,170,432 | B1 | 1/2001 | Szapucki et al. |
| 6,173,673 | B1 | 1/2001 | Golovato et al. |
| 6,827,815 | B2 | 12/2004 | Hytros et al. |
| 6,899,786 | B2 | 5/2005 | Senzaki et al. |
| 6,974,523 | B2 * | 12/2005 | Benzing et al. ......... 156/345.47 |
| 7,270,713 | B2 | 9/2007 | Blonigan et al. |
| 7,296,534 | B2 | 11/2007 | Fink |
| 7,645,341 | B2 | 1/2010 | Kennedy et al. |
| 2003/0066607 | A1 * | 4/2003 | White et al. ............. 156/345.34 |
| 2003/0185729 | A1 | 10/2003 | Ko et al. |
| 2005/0133160 | A1 * | 6/2005 | Kennedy et al. ......... 156/345.34 |
| 2006/0266852 | A1 | 11/2006 | Choi |
| 2008/0087641 | A1 | 4/2008 | de la Llera et al. |
| 2008/0099120 | A1 * | 5/2008 | Larson et al. .................... 156/1 |
| 2008/0308228 | A1 | 12/2008 | Stevenson et al. |
| 2008/0308229 | A1 | 12/2008 | Patrick et al. |
| 2009/0095424 | A1 * | 4/2009 | Bettencourt et al. ..... 156/345.34 |
| 2009/0236040 | A1 | 9/2009 | Patrick et al. |
| 2010/0000683 | A1 * | 1/2010 | Kadkhodayan et al. . 156/345.34 |
| 2010/0003824 | A1 * | 1/2010 | Kadkhodayan et al. ...... 438/710 |
| 2010/0003829 | A1 * | 1/2010 | Patrick et al. ................. 438/758 |
| 2010/0038033 | A1 | 2/2010 | Hardin et al. |
| 2010/0252197 | A1 | 10/2010 | Kadkhodayan et al. |
| 2010/0261354 | A1 * | 10/2010 | Bettencourt et al. .......... 438/710 |

OTHER PUBLICATIONS

Commonly Owned Utility U.S. Appl. No. 12/875,869, filed Sep. 3, 2010.

Commonly Owned Utility U.S. Appl. No. 12/884,269, filed Sep. 17, 2010.

Commonly Owned Utility U.S. Appl. No. 12/903,412, filed Oct. 13, 2010.

Commonly Owned Utility U.S. Appl. No. 12/872,980, filed Aug. 31, 2010.

Commonly Owned Utility U.S. Appl. No. 12/872,982, filed Aug. 31, 2010.

Commonly Owned Utility U.S. Appl. No. 12/872,984, filed Aug. 31, 2010.

Search Report and Written Opinion mailed Sep. 28, 2012 for Singapore Application No. 201109324-2.

* cited by examiner

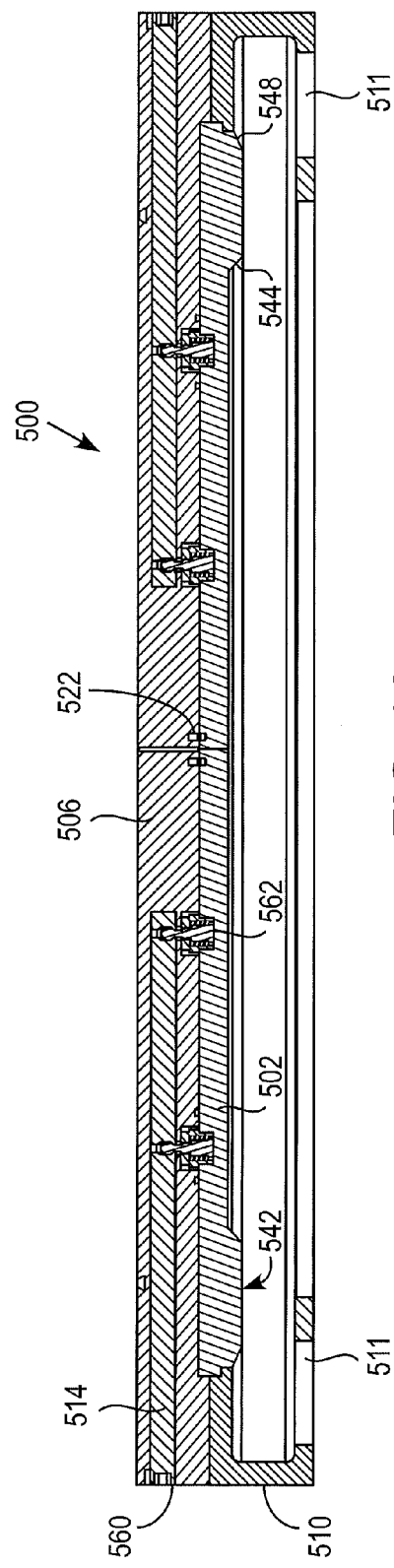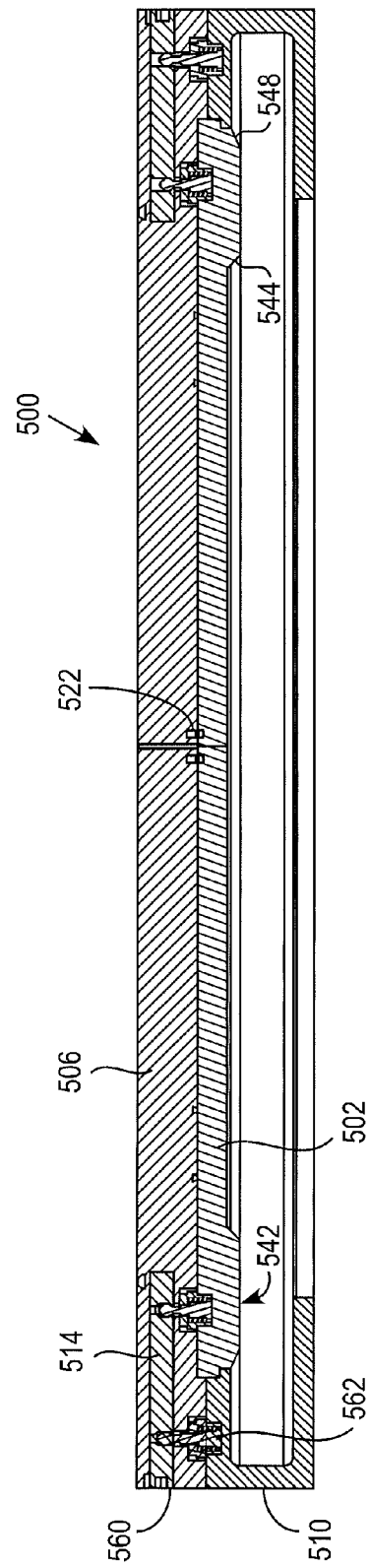
FIG. 1A
FIG. 1B

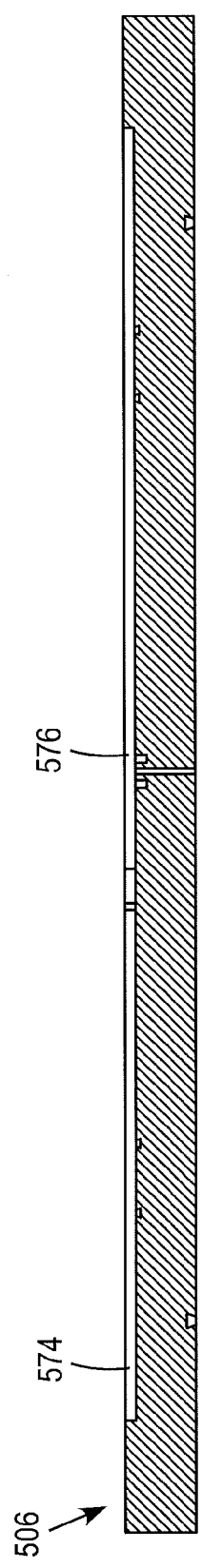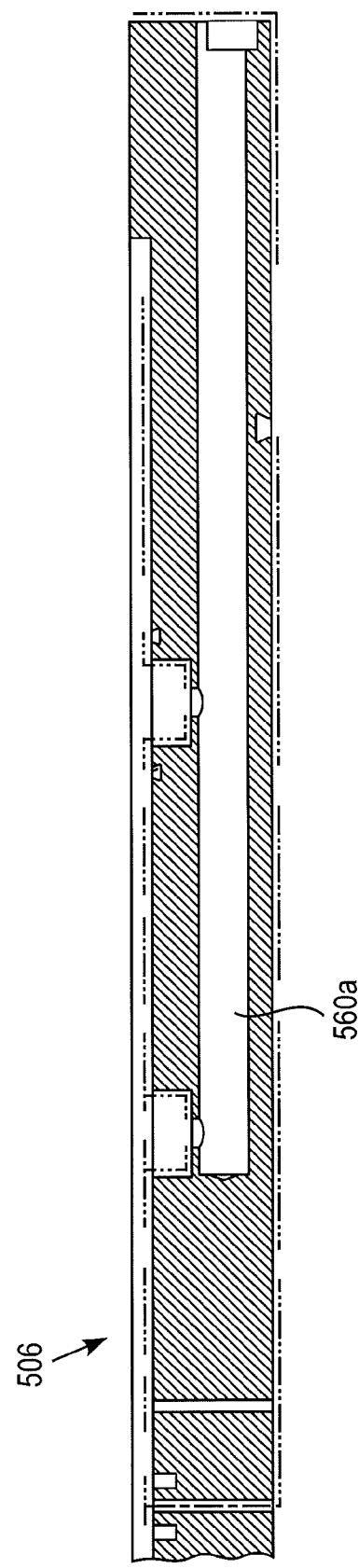

CAM-LOCKED SHOWERHEAD ELECTRODE AND ASSEMBLY

The invention relates to a showerhead electrode of a parallel plate capacitively coupled plasma processing chamber wherein semiconductor components can be manufactured.

BACKGROUND

The fabrication of an integrated circuit chip typically begins with a thin, polished slice of high-purity, single crystal semiconductor material substrate (such as silicon or germanium) called a "substrate." Each substrate is subjected to a sequence of physical and chemical processing steps that form the various circuit structures on the substrate. During the fabrication process, various types of thin films may be deposited on the substrate using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor substrate, the unique electrical properties of semiconductors are produced by substituting selected impurities into the semiconductor crystal lattice using a process called doping. The doped silicon substrate may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

Due to increasing power requirements and associated heating of the showerhead electrode, there is a need for better mounting arrangements which provide better thermal contact between the showerhead electrode and the backing plate and reduction of warping of the heated showerhead electrode.

SUMMARY

Described herein is a showerhead electrode adapted for use in a showerhead electrode assembly in a capacitively coupled plasma processing chamber. The showerhead electrode assembly comprises a backing plate having gas injection holes extending between upper and lower faces thereof, an alignment ring, a plurality of fasteners which attach the showerhead electrode to the backing plate, and a plurality of alignment pins. The showerhead electrode comprises a plasma exposed surface on a lower face thereof, a mounting surface on an upper face thereof. A plurality of gas injection holes extending between the plasma exposed surface and the mounting surface are arranged in a pattern matching the gas injection holes in the backing plate. A plurality of unthreaded blind holes in the mounting surface are configured to receive the alignment pins. An annular groove in the mounting surface is configured to receive the alignment ring. Concentric rows of threaded blind holes in the mounting surface are configured to receive fasteners which attach the showerhead electrode to the backing plate, the concentric rows including an inner row comprising 8 threaded blind holes located on a radius $1/8$ to $1/2$ a total distance from a center to an outer edge of the showerhead electrode, a middle row comprising 8 threaded blind holes located on a radius $1/2$ to $3/4$ the total distance from the center to the outer edge of the showerhead electrode, and an outer row comprising 8 threaded blind holes located on a radius $3/4$ to $7/8$ the total distance from the center to the outer edge of the showerhead electrode, wherein a line passing through the center of the showerhead electrode passes through two of the threaded blind holes of the inner row and two of the threaded blind holes of the middle row.

BRIEF DESCRIPTION OF THE DRAWINGS

FIG. 1A is a cross-sectional view of a showerhead electrode assembly showing two cam-locks at inner locations and FIG. 1B is a cross-sectional view of the showerhead electrode assembly at a different location showing two outer cam-locks.

FIG. 13 is a radial cross-section of the backing plate in FIG. 8.

FIG. 14 is a partial cross-sectional view through a cam shaft bore and two inner cam lock locations in the backing plate in FIG. 8.

DETAILED DESCRIPTION

Figure 2:
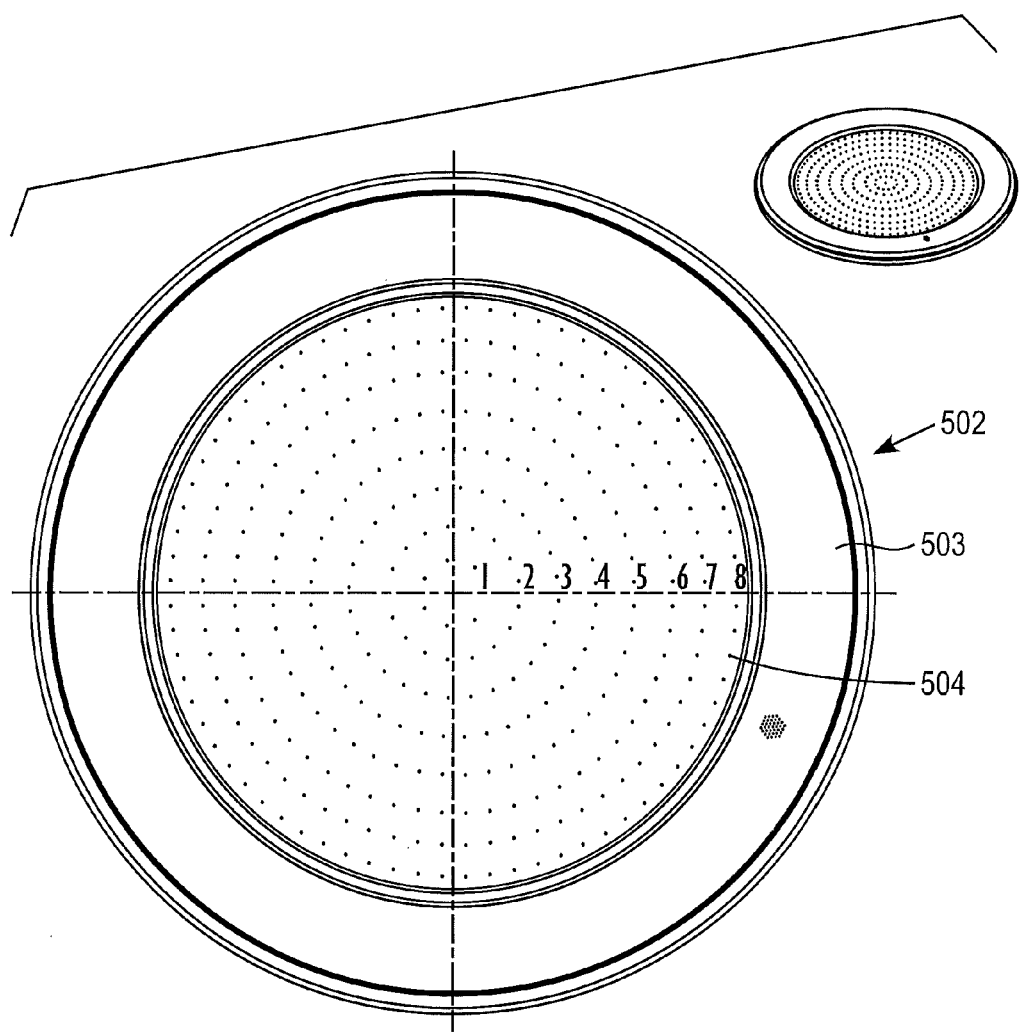
FIG. 2 is a bottom view of a showerhead electrode in the showerhead electrode assembly in FIG. 1.

A plasma reaction chamber typically consists of a vacuum chamber with an upper electrode assembly and a lower electrode assembly positioned therein. A substrate (usually a semiconductor) to be processed is covered by a suitable mask and placed directly on the lower electrode assembly. A process gas such as $CF_4$, $CHF_3$, $CClF_3$, $HBr$, $Cl_2$, $SF_6$ or mixtures thereof is introduced into the chamber with gases such as $O_2$, $N_2$, $He$, $Ar$ or mixtures thereof. The chamber is maintained at a pressure typically in the millitorr range. The upper electrode assembly is provided with gas injection hole(s), which permit the gas to be uniformly dispersed through the upper electrode assembly into the chamber. One or more radio-frequency (RF) power supplies transmit RF power into the vacuum chamber and dissociate neutral process gas molecules into a plasma. Highly reactive radicals in the plasma are forced towards the substrate surface by an electrical field between the upper and lower electrodes. The surface of the substrate is etched or deposited on by chemical reaction with the radicals. The upper electrode assembly includes a showerhead electrode attached to a backing plate made of a different material from the showerhead electrode. The showerhead electrode is heated by the plasma and/or a heater arrangement during operation and may warp, which can adversely affect uniformity of processing rate across the substrate. In addition, differential thermal expansion of the showerhead electrode and the backing plate can lead to rubbing therebetween during repeated thermal cycles. Rubbing can produce particulate contaminants that degrade the device yield from the substrate.

To reduce warping of the showerhead electrode, described herein is a fastening arrangement which includes laterally distributed cam locks engaged with a mounting surface of the showerhead electrode.

FIG. 1A shows a partial cross-sectional view at one location of a portion of a showerhead electrode assembly 500 of a plasma reaction chamber for etching semiconductor substrates and FIG. 1B shows a partial cross-sectional view at a different location. As shown in FIG. 1A, the showerhead electrode assembly 500 includes a showerhead electrode 502, a backing plate 506 and an annular shroud extension 510 having a C-shaped cross-section with gas passages 511 in a bottom wall thereof. The assembly 500 can be mounted to a thermal control plate (not shown) which is attached to a temperature controlled upper wall (not shown) of the vacuum chamber. Details of a thermal control plate and upper wall are provided in commonly-assigned U.S. Published Application 2010/0003829, the disclosure of which is hereby incorporated by reference. The showerhead electrode 502 may be made of a conductive high purity material such as single crystal silicon, polycrystalline silicon, silicon carbide or other suitable material. The showerhead electrode 502 is a consumable part which must be replaced periodically. The backing plate 506 is mechanically secured to the showerhead electrode 502 with cam lock fasteners described below.

The showerhead electrode assembly 500 as shown in FIG. 1A when mounted in a plasma chamber is located opposite to a substrate support incorporating an electrostatic chuck (not shown) forming part of a flat lower electrode assembly on which a substrate is supported spaced 1 to 5 cm below the showerhead electrode 502. An example of such a plasma reaction chamber is a parallel plate type reactor, such as the Exelan™ dielectric etch systems, made by Lam Research Corporation of Fremont, Calif. Such chucking arrangements provide temperature control of the substrate by supplying backside helium (He) pressure, which controls the rate of heat transfer between the substrate and the chuck. The chuck can be moved vertically to locate the wafer above the bottom wall of the C-shroud 510. Gases can be removed from a gap between the wafer and the showerhead electrode via radially extending slits 511 in the bottom wall of the C-shroud. During plasma processing, the cam locks provide a constant load on the showerhead electrode while avoiding overloading due to thermal movement between the backing plate and the showerhead electrode.

During use, process gas from a gas source is supplied to showerhead electrode 502 through one or more passages in the top wall which permit process gas to be supplied to a single zone or multiple zones above the substrate in the gap between the showerhead electrode and the substrate to be processed.

The showerhead electrode 502 is preferably a planar disk or plate having an annular step 542 around an outer portion thereof. The step 542 includes an inner inclined surface 544 and an outer inclined surface 548. The showerhead electrode 502 can have a diameter larger than a substrate to be processed, e.g., over 300 mm. For processing 300 mm substrates, the showerhead electrode 502 can have a diameter of about 17 inches (as used herein, "about" refers to ±10%). The showerhead electrode 502 can be a single piece of material (e.g., single crystal silicon, polycrystalline silicon, silicon carbide or other suitable material). To supply process gas to the gap between the substrate and the showerhead electrode 502, the showerhead electrode 502 is provided with a plurality of gas injection holes 504 (see FIG. 2), which are of a size and distribution suitable for supplying a process gas, which is energized into a plasma in a reaction zone beneath the showerhead electrode 502.

Single crystal silicon is a preferred material for plasma exposed surface of the showerhead electrode 502. High-purity, single crystal silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surface of the showerhead electrode 502 include polycrystalline silicon, $Y_2O_3$, SiC, $Si_3N_4$, and AlN, for example.

In an embodiment, the showerhead electrode assembly 500 is large enough for processing large substrates, such as semiconductor substrates having a diameter of 300 mm. However, the showerhead electrode assembly 500 can be sized to process other substrate sizes.

The backing plate 506 is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing plate 506 include, but are not limited to, graphite, SiC, aluminum (Al), or other suitable materials.

The backing plate 506 is preferably attached to the thermal control plate with suitable mechanical fasteners, which can be threaded bolts, screws, or the like. For example, bolts (not shown) can be inserted in holes in the thermal control plate and screwed into threaded openings in the backing plate 506. The thermal control plate is preferably made of a machined metallic material, such as aluminum, an aluminum alloy or the like. The upper temperature controlled plate is preferably made of aluminum or an aluminum alloy.

The showerhead electrode 502 can be mechanically attached to the backing plate 506 by a cam lock mechanism as described in commonly-assigned WO2009/114175 (published on Sep. 17, 2009) and U.S. Published Application 2010/0003824, the disclosures of which are hereby incorporated by reference. With reference to FIG. 1A, a pair of inner cam locks 562 is shown attaching the showerhead electrode 502 to the backing plate 506. Each cam lock is capable of quickly, cleanly, and accurately attaching the showerhead electrode 502 to the backing plate 506 in a variety of semiconductor fabrication-related tools, such as a plasma etch chamber.

The cam lock includes a stud (locking pin) mounted into a socket and the stud may be surrounded by a disc spring stack, such, for example, stainless steel Belleville washers. The stud and disc spring stack may then be press-fit or otherwise fastened into the socket through the use of adhesives or mechanical fasteners. The stud and the disc spring stack are arranged into the socket such that a constant load can be applied to the showerhead electrode to maintain desired thermal and electrical contact between the showerhead electrode and the backing plate while allowing a limited amount of lateral movement between the showerhead electrode 502 and the backing plate 506 during thermal cycling. Limiting the amount of lateral movement allows for a tight fit between the showerhead electrode 502 and the backing plate 506, thus ensuring good thermal contact, while still providing some movement to account for differences in thermal expansion between the two parts. Additional details on the limited lateral movement feature are discussed in more detail below.

In a specific exemplary embodiment, the socket is fabricated from high strength Torlon®. Alternatively, the socket may be fabricated from other materials possessing certain mechanical characteristics such as good strength and impact resistance, creep resistance, dimensional stability, radiation resistance, and chemical resistance may be readily employed. Various materials such as polyamide-imide, acetals, and ultra-high molecular weight polyethylene materials may all be suitable. High temperature-specific plastics and other related materials are not required for forming the socket as 230° C. is a typical maximum temperature encountered in applications such as etch chambers. Generally, a typical operating temperature is closer to 130° C.

Other portions of the cam lock are comprised of a cam shaft 514 optionally surrounded at each end by a pair of cam shaft bearings. The cam shaft 514 and cam shaft bearing assembly is mounted into a backing plate bore 560 machined into the backing plate 506. In a typical application for an etch chamber designed for 300 mm semiconductor substrates, the cam locks can be located in concentric rows across the showerhead electrode 502.

The cam shaft bearings may be machined from a variety of materials including Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding. The stud and cam shaft may be machined from stainless steel (e.g., 316, 316L, 17-7, NITRONIC-60, etc.) or any other material providing good strength and corrosion resistance.

FIGS. 2-7 show details of the showerhead electrode 502. The showerhead electrode 502 is preferably a plate of high purity (less than 10 ppm impurities) low resistivity (0.005 to 0.02 ohm-cm) single crystal silicon.

FIG. 2 is a bottom view of the showerhead electrode 502, showing a plasma exposed surface 503. Gas injection holes 504 of suitable diameter and/or configuration extend from a mounting surface 505 to the plasma exposed surface 503 and can be arranged in any suitable pattern inwardly of the step 542. Preferably, the diameter of the gas injection holes 504 is less than or equal to 0.04 inch; more preferably, the diameter of the gas injection holes 504 is between 0.01 and 0.03 inch; further preferably, the diameter of the gas injection holes 504 is about 0.02 inch. In the embodiment shown, one gas injection hole is located at the center of the showerhead electrode 502; the other gas injection holes are arranged in eight concentric rows with 7 gas injection holes in the first row located about 0.6-0.7 (e.g. 0.68) inch from the center of the electrode, 17 gas injection holes in the second row located about 1.3-1.4 (e.g. 1.34) inch from the center, 28 gas injection holes in the third row located about 2.1-2.2 (e.g. 2.12) inches from the center, 40 gas injection holes in the fourth row located about 2.8-3.0 (e.g. 2.90) inches from the center, 48 gas injection holes in the fifth row located about 3.6-3.7 (e.g. 3.67) inches from the center, 56 gas injection holes in the sixth row located about 4.4-4.5 (e.g. 4.45) inches from the center, 64 gas injection holes in the seventh row located about 5.0-5.1 (e.g. 5.09) inches from the center, and 72 gas injection holes in the eighth row located about 5.7-5.8 (e.g. 5.73) inches from the center. The gas injection holes in each of these rows are azimuthally evenly spaced.

Figure 3:
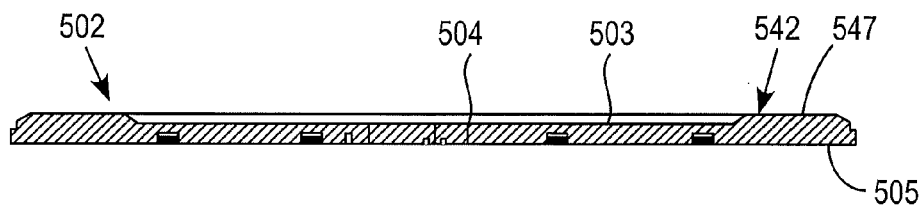
FIG. 3 is a cross-sectional view of the electrode in FIG. 2.
Figure 7:
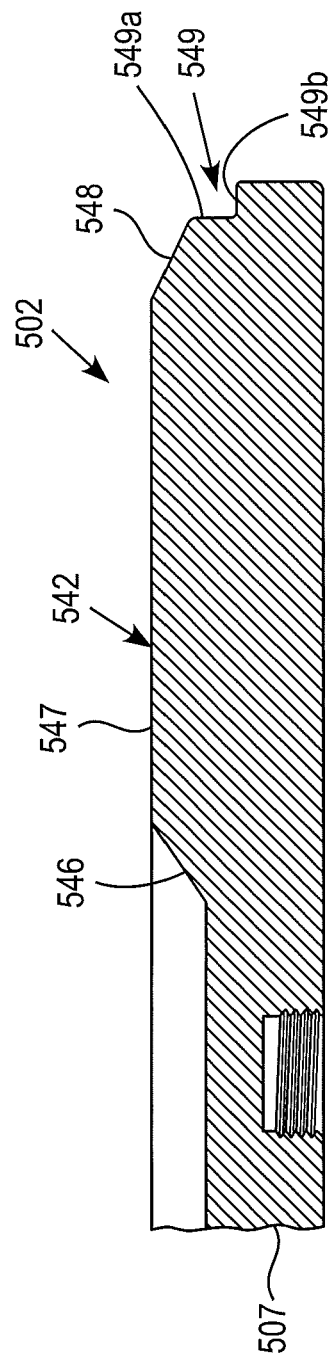
FIG. 7 is a partial cross-sectional view of a threaded bore in the electrode in FIG. 2.

FIG. 3 is a cross-sectional view of the showerhead electrode 502 along a diameter thereof. The outer circumferential surface includes a step 542. FIG. 7 is an enlarged view of the step 542 in FIG. 2. The step 542 includes a planar annular surface 547 which extends completely around the showerhead electrode 502. In a preferred embodiment, the showerhead electrode 502 has an inner portion 507 of uniform thickness inwardly of the step 542. The inner portion 507 preferably has a uniform thickness of about 0.40 inch and an outer diameter of about 12 inches. The inner inclined surface 546 begins at the outer edge of the inner portion 507 and an outer diameter of the inner inclined surface 546 has a diameter of about 12.5 to 13.5 inches. The outer inclined surface 548 has an inner diameter of about 15.7 to 16.2 inches and an outer diameter of about 16.8 inches. The inner inclined surface 546 is preferably inclined at an angle of 20° to 45°, e.g., about 25° to the planar annular surface 547 and the outer inclined surface 548 can be inclined at an angle of 20 to 30°, e.g., about 25° to the planar annular surface 547. The thickness between the mounting surface 505 and the annular surface 547 is about 0.65 inch. The showerhead electrode includes an outer step 549 formed by a vertical surface 549*a* which extends about 0.15 inch and a horizontal surface 549*b* which extends about 0.12 inch.

Figure 4:
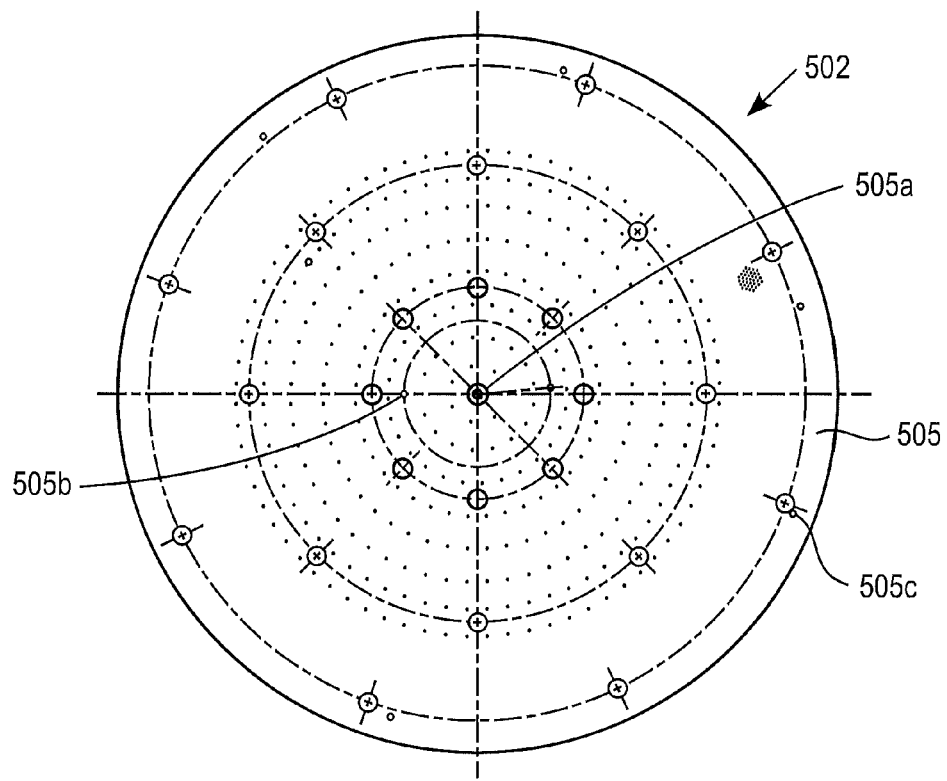
FIG. 4 is a top view of the electrode in FIG. 2.
Figure 5:
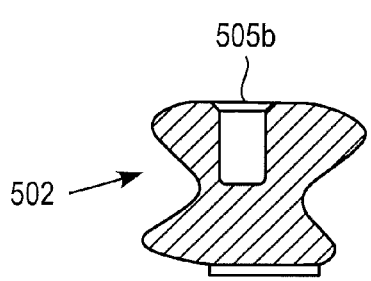
FIG. 5 is a partial cross-section of a pin alignment hole in the electrode in FIG. 2.
Figure 6:
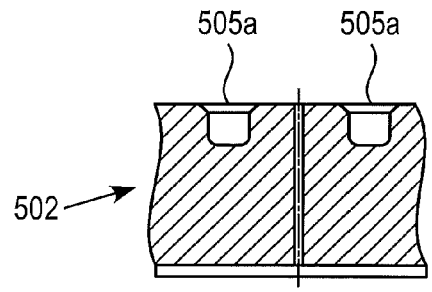
FIG. 6 is a partial cross-sectional view of an annular groove in the electrode in FIG. 2.

FIG. 4 is a top view of the showerhead electrode 502, showing the mounting surface 505. The mounting surface 505 includes an annular groove 505*a* (details shown in FIG. 6) concentric with the showerhead electrode 502, the annular groove 505*a* having an inner diameter of about 0.24 inch, an outer diameter of about 0.44 inch, a depth of at least 0.1 inch, a 45° chamfer of about 0.02 inch wide on the entrance edge, and a fillet of a radius between 0.015 and 0.03 inch on the bottom corners.

The mounting surface 505 also includes two smooth (unthreaded) blind holes 505*b* configured to receive alignment pins (details shown in FIG. 5) located at a radius between 1.72 and 1.73 inches from the center of the showerhead electrode 502 and offset by about 175° from each other, the blind holes 505*b* having a diameter of about 0.11 to 0.12 inch, a depth of at least 0.1 inch, a 45° chamfer of about 0.02 inch on an entrance edge, and a fillet with a radius of at most 0.02 inch on a bottom corner.

The mounting surface 505 also includes threaded blind holes 505*c* arranged in annular mounting hole zones which divide the mounting surface 505 into a central portion, an intermediate portion and an outer portion. The mounting hole zones are preferably located on an inner radius of 10 to 30% of the radius of the showerhead electrode 502, an intermediate radius of 50 to 70% of the radius of the showerhead electrode 502, and an outer radius of 80 to 95% of the radius of the showerhead electrode 502. In a preferred embodiment, a row of eight 7/16-28 (Unified Thread Standard) threaded blind holes 502*c* are located on an inner radius between 2.4 and 2.6 inches (e.g., 2.5 inches) from the center of the showerhead electrode 502 and azimuthally offset by about 45° between each pair of adjacent holes 502*c*, another row of 8 threaded holes on a radius between 5 and 6 inches (e.g., 5.4 inches), and an outer row of 8 threaded holes on a radius between 7 and 8 inches (e.g., 7.7 inches). Each of the holes 502*c* has a total depth of about 0.2 inch, a threaded depth of at least 0.16 inch from the entrance edge, and a 45° chamfer of about 0.03 inch wide on the entrance edge. In each row, one of the holes 502*c* is azimuthally aligned with another one of the holes 502*c*. As used herein, two objects being "azimuthally aligned" means a straight line connecting these two objects passes through the center of a circle or ring, in this embodiment, the center of the showerhead electrode 502.

The mounting surface 505 further includes first, second and third smooth (unthreaded) blind holes 505*b* configured to receive alignment pins (not shown) radially aligned at a radius between 7.9 and 8, preferably about 7.93 inches from the center of the showerhead electrode 502. "Radially aligned" means the distances to the center are equal. The holes 505*b* have a diameter between 0.11 and 0.12 inch, a depth of at least 0.1 inch, a 45° chamfer of about 0.02 inch wide on an entrance edge, and a fillet with a radius of at most 0.02 inch on a bottom corner. One of the three outer holes 505b is offset by about 15° counterclockwise azimuthally from one of the threaded blind holes 505c in the second concentric row of holes 505c. A second of the three holes 505b is offset by about 120° clockwise azimuthally from the first hole 505b. The third hole 505b is offset by about 125° clockwise azimuthally from the second hole 505b.

Figure 8:
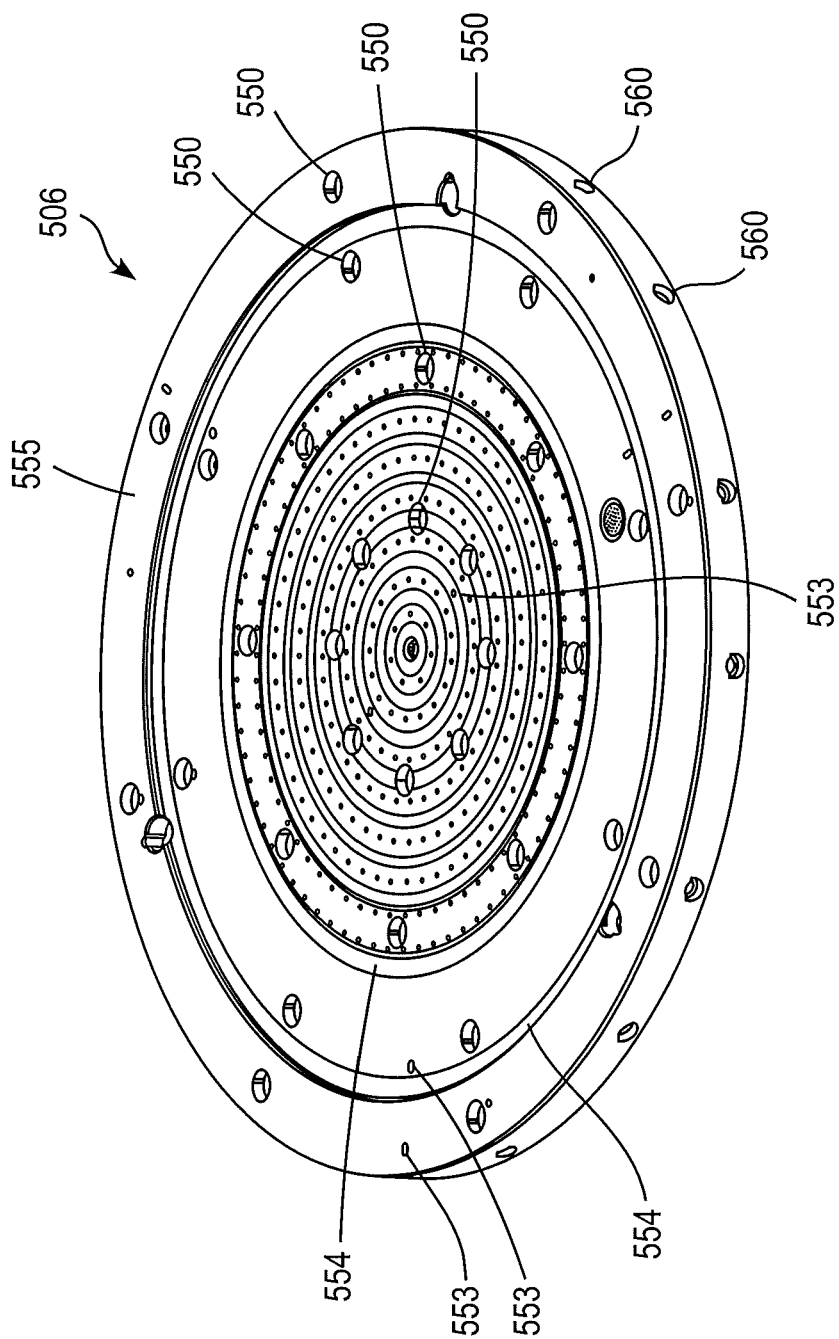
FIG. 8 is a perspective view of a backing plate in showerhead electrode assembly in FIG. 1.
Figure 9:
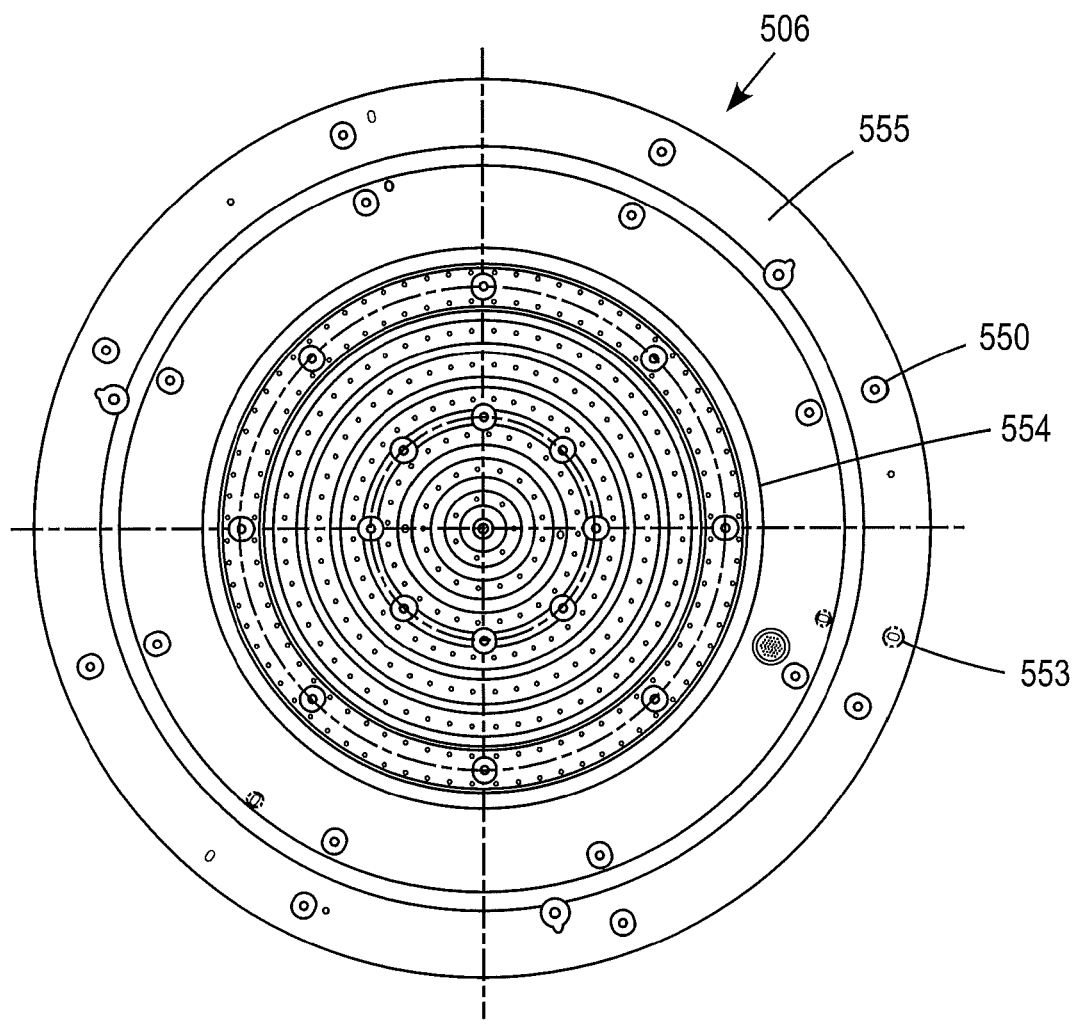
FIG. 9 is a bottom view of the backing plate in FIG. 8.
Figure 10:
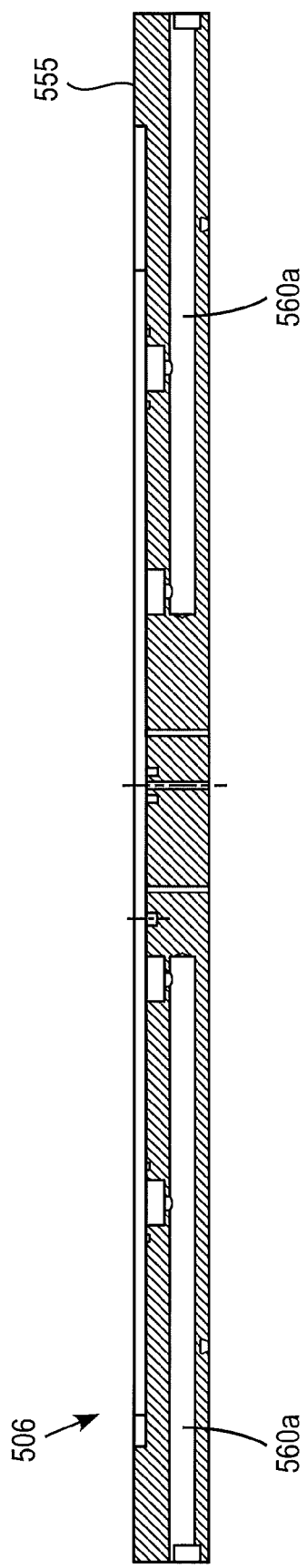
FIG. 10 is a partial cross-sectional view of the backing plate in FIG. 8.
Figure 11:
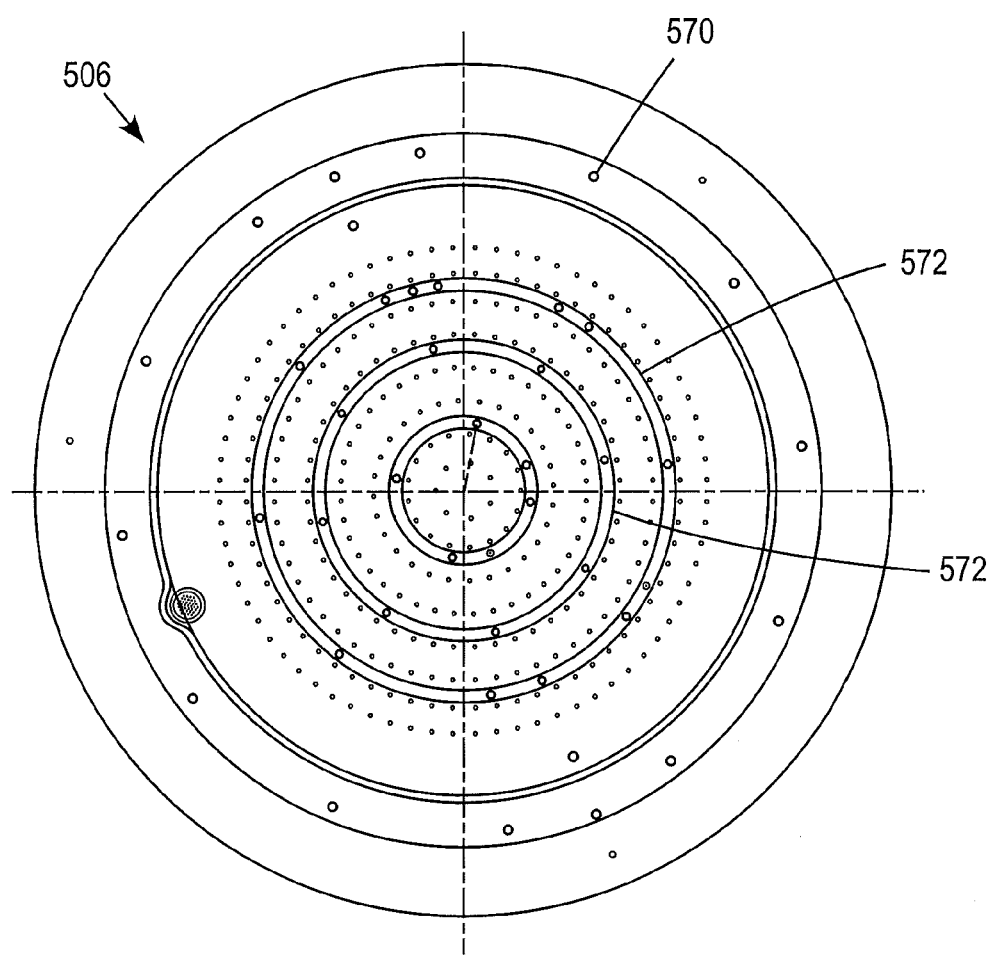
FIG. 11 is a top view of the backing plate in FIG. 10.
Figure 12:
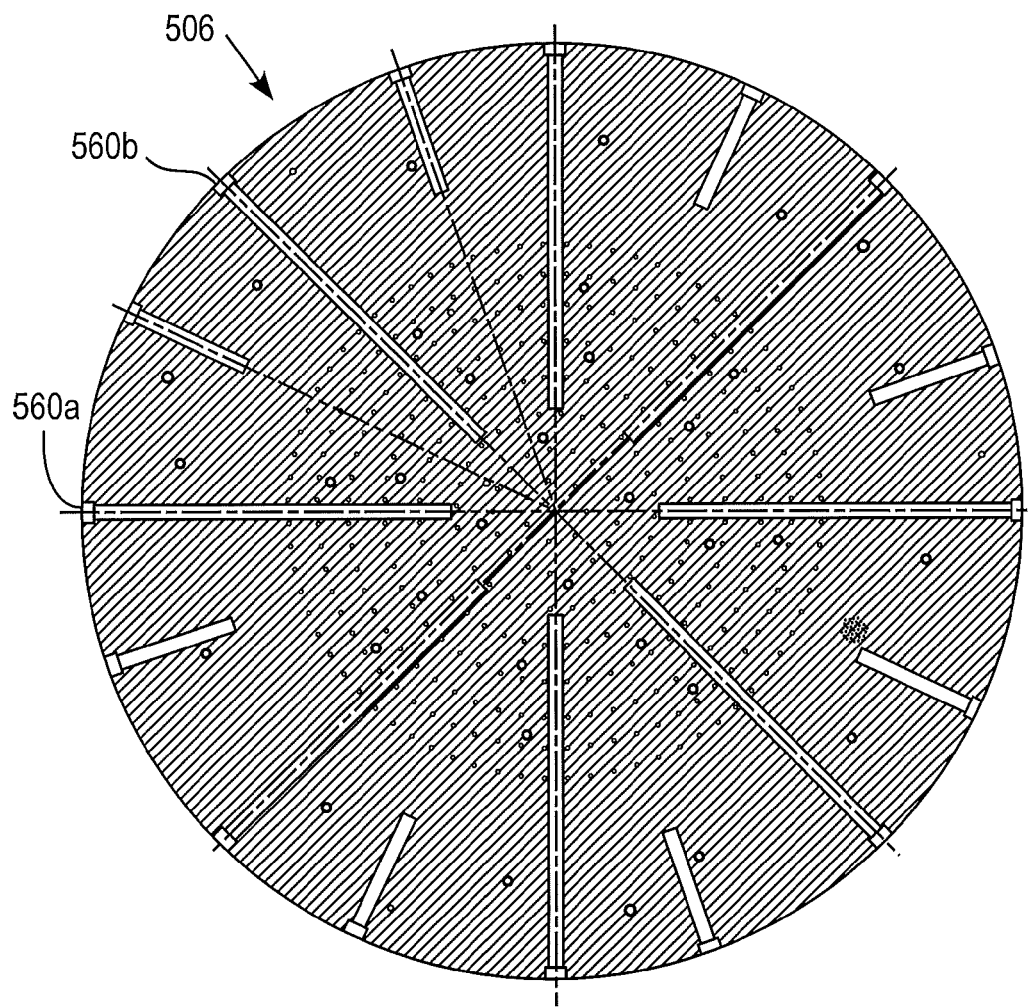
FIG. 12 is a transverse cross-section of the backing plate in FIG. 8.
Figure 15:
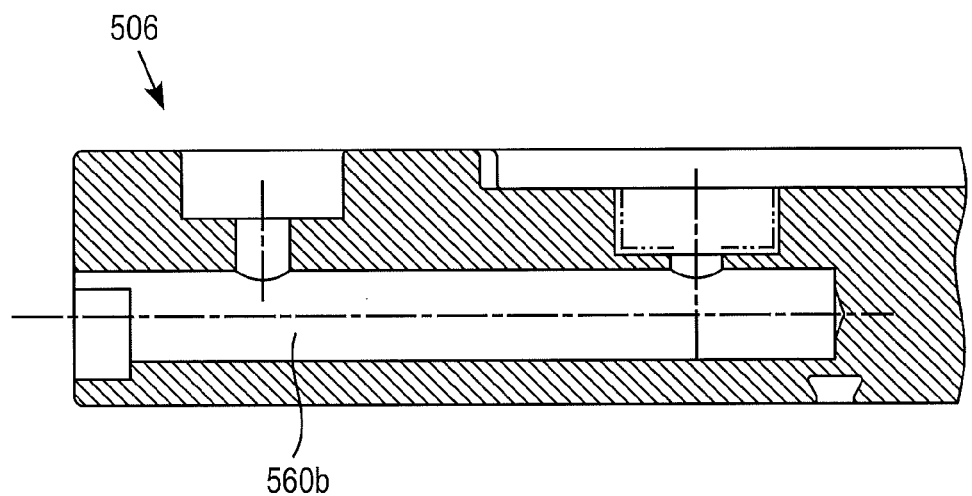
FIG. 15 is a partial cross-sectional view through a cam shaft bore and two outer cam lock locations in the backing plate in FIG. 8.

FIG. 8 is a perspective view of a backing plate 506 wherein four concentric rows of holes 550 are provided to receive studs of the cam locks, the inner three rows engaging the studs on the showerhead electrode and the outer row engaging studs on a C-shroud extension 510 which surrounds the showerhead electrode 502. FIG. 9 is a bottom view of the backing plate 506, FIG. 10 is a cross-section of the backing plate 506 at a location where horizontal bores 560a allow a camshaft 514 to simultaneously actuate two inner cam locks, FIG. 11 is a top view of the backing plate 506 showing locations of fastener holes 570 for attachment of the backing plate to the thermal control plate and annular channels 572 for receipt of electrical and thermal gaskets, FIG. 12 is a cross-section through the middle of the backing plate 506 showing bores 560a to receive camshafts to actuate the two inner rows of cam locks and short bores 560b to receive camshafts to actuate the two outer rows of cam locks. FIG. 13 is a cross-section of the backing plate 506 showing a recess 574 in which the showerhead electrode 502 is received and an annular channel 576 which receives the alignment ring, FIG. 14 is a cross-section showing half of the backing plate 506 at a location of a bore 560a, and FIG. 15 is a cross-section of an outer portion of the backing plate at a location of one of the bores 560b.

When the showerhead electrode 502 is installed in the showerhead electrode assembly 500, an alignment ring 522, two inner alignment pins and three outer alignment pins are first inserted into the annular groove 505a and holes 505b, respectively and stud assemblies of the cam locks are mounted in the threaded holes 505c. The alignment pins are received in holes 553 in the backing plate 506. A gasket arrangement designed to fit in annular seats 554 on a lower surface 555 of the backing plate 506 (see FIG. 8) is then mounted to the showerhead electrode 502 which is fastened against the backing plate 506 by rotating cam shafts 514 in the backing plate 506 so as to engage the studs of the stud assemblies mounted on the showerhead electrode 502.

The cam locks 562 provide points of mechanical support, improve thermal contact with the backing plate 506, reduce warping of the showerhead electrode 502, and hence reduce processing rate non-uniformity and thermal non-uniformity.

In the embodiment shown, the showerhead electrode 502 is mechanically attached to the backing plate 506 by 24 cam locks. The cam locks include a stud/socket assembly comprising a stud (locking pin) mounted into a socket.

To allow simultaneous engagement of the inner and middle rows of cam locks on the showerhead electrode, eight elongated cam shafts are mounted into backing plate bores 560a (see FIG. 10) machined into the backing plate. Each cam shaft engages on a stud/socket assembly of one cam lock on the inner row of cam locks and a stud/socket assembly of one cam lock on the middle row of cam locks.

Each cam lock operates by placing the showerhead electrode 502 in close proximity to the backing plate 506, inserting the stud of each socket assembly into corresponding holes in the backing plate 506 and rotating the cam shafts to engage cut-outs in the cam shafts with the heads of the studs. Each stud/socket assembly may be screwed, by means of external threads on the socket into a threaded hole 505c in the showerhead electrode 502.

The cam shafts can be rotated by engaging a tool such as a hexagonal key in a hex opening on one end of each cam shaft.

For example, a keying stud can limit rotational travel of the cam shaft in the backing plate bore by interfacing with a step on an entrance of the bore. Each cam shaft has two internal eccentric cutouts. One cutout engages an enlarged head of the stud on the inner row of studs on the showerhead electrode 502 and the other cutout engages an enlarged head of the stud on the middle row of studs. The cam shaft may first be turned in one direction though use of the hex opening, for example, counter-clockwise, to allow entry of the studs into the cam shaft, and then turned clockwise to fully engage and lock the studs. The clamp force required to hold the showerhead electrode to the backing plate is supplied by compressing the disc spring stacks beyond their free stack height. As the disc spring stacks compress, the clamp force is transmitted from individual springs in the disc spring stacks to the sockets and through the showerhead electrode to the backing plate 506.

In an exemplary mode of operation, the cam shaft is inserted into the backing plate bore, the cam shaft is rotated counterclockwise to its full rotational travel, the stud/socket assemblies lightly torqued into the showerhead electrode 502 are then inserted into vertically extending through holes 550 below the horizontally extending backing plate bore 560 such that the heads of the studs engage in the eccentric cutouts in the cam shaft. The showerhead electrode 502 is held against the backing plate 506 and the cam shaft is rotated clockwise until the keying pin is limited by the step on the entrance of the bore. The exemplary mode of operation may be reversed to dismount the showerhead electrode 502 from the backing plate 506.

In order to operate at high power on the order of 8000 watts, it is desirable to provide thermal gaskets between the showerhead electrode and the aluminum backing plate and between the backing plate and the thermal control plate. For example, the gaskets between the showerhead electrode 502 and the backing plate 506 are preferably electrically and thermally conductive and made of a material without excessive outgas in a vacuum environment, e.g., about 10 to 200 mTorr, having low particle generation, being compliant to accommodate shear at contact points, and free of metallic components that are lifetime killers in semiconductor substrates such as Ag, Ni, Cu and the like. The gaskets can be a silicone-aluminum foil sandwich gasket structure or an elastomer-stainless steel sandwich gasket structure. The gaskets can be an aluminum sheet coated on upper and lower sides with a thermally and electrically conductive rubber compatible in a vacuum environment used in semiconductor manufacturing wherein steps such as plasma etching are carried out. The gaskets are preferably compliant such that they can be compressed when the electrode and backing plate are mechanically clamped together but prevent opposed surfaces of the electrode and backing plate from rubbing against each other during temperature cycling of the showerhead electrode. To provide protection from particle generation, the gaskets can be isolated form gas holes by suitable O-ring arrangements. The gaskets can be manufactured of a suitable material such as "Q-PAD II" available from the Bergquist Company. The thickness of the gaskets is preferably about 0.006 inch. The various features of the gaskets can be knife-cut, stamped, punched, or preferably laser-cut from a continuous sheet. The gasket set is mounted between the backing plate and the showerhead electrode to provide electrical and thermal contact therebetween.

The gaskets can be annular rings or a series of rings and spokes arranged in any suitable pattern as long as they do not obstruct the gas injection holes 504, the cam locks 562, alignment ring, or alignment pins in the showerhead electrode 502.

While the showerhead electrode assemblies, inner electrodes, outer electrodes and gasket sets have been described in detail with reference to specific embodiments thereof, it will be apparent to those skilled in the art that various changes and modifications can be made, and equivalents employed, without departing from the scope of the appended claims.

We claim:

1. A showerhead electrode adapted for use in a showerhead electrode assembly in a capacitively coupled plasma processing chamber wherein the showerhead electrode assembly comprises a backing plate having gas injection holes extending between upper and lower faces thereof, an alignment ring, a plurality of cam locks comprising studs and rotatable cam shafts which attach the showerhead electrode to the backing plate, and a plurality of alignment pins; the showerhead electrode comprising:

a plasma exposed surface on a lower face thereof;
a mounting surface on an upper face thereof;
a plurality of gas injection holes extending between the plasma exposed surface and the mounting surface thereof and arranged in a pattern matching the gas injection holes in the backing plate;
a plurality of unthreaded blind holes in the mounting surface configured to receive the alignment pins;
an annular groove concentric with a center of the mounting surface and configured to receive the alignment ring; and
concentric rows of threaded blind holes in the mounting surface configured to receive studs which attach the showerhead electrode to the backing plate, the concentric rows including an inner row comprising 8 threaded blind holes located on a radius ⅛ to ½ a total distance from a center to an outer edge of the showerhead electrode, a middle row comprising 8 threaded blind holes located on a radius ½ to ¾ the total distance from the center to the outer edge of the showerhead electrode, and an outer row comprising 8 threaded blind holes located on a radius ¾ to ⅞ the total distance from the center to the outer edge of the showerhead electrode, wherein a line passing through the center of the showerhead electrode passes through two of the threaded blind holes of the inner row and two of the threaded blind holes of the middle row to allow the camshaft to simultaneously engage and actuate inner and middle rows of the cam locks on the showerhead electrode.

2. The showerhead electrode of claim 1, wherein the showerhead electrode has an outer diameter of about 17 inches, the gas injection holes have a diameter less than or equal to 0.04 inch and are arranged in a pattern with one center gas injection hole at the center of the showerhead electrode and eight concentric rows of gas injection holes, the first row having seven gas injection holes located at a radial distance of about 0.6-0.7 inch from the center of the showerhead electrode;
the second row having seventeen gas injection holes located at a radial distance of about 1.3-1.4 inches from the center of the showerhead electrode;
the third row having twenty-eight gas injection holes located at a radial distance of about 2.1-2.2 inches from the center of the showerhead electrode;
the fourth row having forty gas injection holes located at a radial distance of about 2.8-3.0 inches from the center of the showerhead electrode;
the fifth row having forty-eight gas injection holes located at a radial distance of about 3.6-3.7 inches from the center of the showerhead electrode;
the sixth row having fifty-six gas injection holes located at a radial distance of about 4.4-4.5 inches from the center of the showerhead electrode;
the seventh row having sixty-four gas injection holes located at a radial distance of about 5.0-5.1 inches from the center of the showerhead electrode;
the eighth row having seventy-two gas injection holes located at a radial distance of about 5.7-5.8 inches from the center of the showerhead electrode;
the gas injection holes in each row are azimuthally equally spaced.

3. The showerhead electrode of claim 1, wherein each threaded blind holes in the concentric rows of threaded blind holes has a depth of about 0.2 inch and is threaded to a thread size of 7/16-28, the inner row located at a radial distance of about 2.5 inches from the center of the showerhead electrode, the middle row located at a radial distance of about 5.4 inches from the center of the showerhead electrode, and the outer row located at a radial distance of about 7.7 inches from the center of the showerhead electrode.

4. The showerhead electrode of claim 3, wherein the threaded blind holes of the outer row are offset 25.5° or 19.5° from the threaded blind holes of the middle row.

5. The showerhead electrode of claim 1, wherein the plurality of unthreaded blind holes configured to receive the alignment pins comprises a first set of holes and a second set of holes;

the first set of holes comprising two holes: (a) located at a radial distance of about 1.7-1.8 inches from the center of the showerhead electrode; (b) radially aligned and azimuthally offset by about 175° from each other with one of the two holes azimuthally aligned with one of the threaded blind holes of the inner row; (c) having a diameter of about 0.10-0.12 inch; (d) having a depth of at least about 0.1 inch;
the second set of holes comprising a first hole, a second hole and a third hole: (a) located at a radial distance of about 7.9-8.0 inches from the center of the showerhead electrode; (b) the first hole azimuthally offset by about 15° counterclockwise from one of the threaded blind holes in the middle row; (c) the second and third holes radially aligned with the first hole and azimuthally offset by about 115° and about 120° from the first hole; (d) having a diameter of about 0.11-0.12 inch; (e) having a depth of at least 0.1 inch.

6. The showerhead electrode of claim 1, wherein:
the showerhead electrode has an outer diameter of about 16.8 inches and includes an inner zone having a uniform thickness of about 0.4 inch and diameter about 12 inches and outer annular zone having a uniform thickness of about 0.58 to 0.65 inch, the outer annular zone having an inner diameter of about 12.5 to 13.5 inches and an outer diameter of about 15.7 to 16.2 inches, an inner inclined surface at an angle of about 25° extending between the inner zone and the outer annular zone, an outer inclined surface at an angle of about 25° extending between the outer annular zone and the outer step, an annular step defined by a vertical surface extending about 0.15 inch from the plasma exposed surface and a horizontal surface extending about 0.12 inch from the outer edge of the showerhead electrode, the annular groove having an outer diameter of about 0.44 inch, an inner diameter of about 0.24 inch and a depth of at least 0.1 inch; the showerhead electrode is manufactured from a plate of single crystalline or polycrystalline silicon with a resistivity between about 0.005 and 0.020 Ohm-cm and a total heavy metal contamination less than 10 parts per million.

7. A showerhead electrode assembly comprising the showerhead electrode of claim 1, the backing plate, and the cam locks comprising the studs with enlarged heads extending from threaded sockets mounted in the threaded blind holes in the showerhead electrode and the rotatable cam shafts mounted in the backing plate, the rotatable cam shafts having eccentric cutouts which engage the enlarged heads of the studs, at least some of the rotatable cam shafts including a plurality of eccentric cutouts which engage a plurality of the enlarged heads such that the stud mounted on the inner row of threaded blind holes and the stud mounted on the middle row of threaded blind holes are simultaneously engaged in cutouts in one of the rotatable cam shafts.

8. The showerhead electrode assembly of claim 7 further comprising an annular shroud surrounding the showerhead electrode, the backing plate including four circular rows of openings extending through a surface of the backing plate facing the showerhead electrode, each of the four circular rows including eight openings, the openings in three of the four circular rows aligned with the studs mounted on the inner, middle and outer rows of threaded blind holes in the showerhead electrode and the openings in the fourth row aligned with studs mounted on the annular shroud, the backing plate including twenty four bores containing the camshafts, eight of the camshafts simultaneously engaging the studs mounted on the annular shroud and the studs mounted on the outer row of threaded blind holes, and eight of the camshafts simultaneously engaging studs mounted on the inner and middle rows of threaded blind holes.

9. The showerhead electrode assembly of claim 7, wherein a lower part of an alignment ring is frictionally held in the annular groove on the mounting surface of the showerhead electrode and an upper part of the alignment ring is frictionally held in an annular groove on the facing surface of the backing plate, lower parts of the alignment pins are frictionally held in the plurality of unthreaded blind holes on the mounting surface of the showerhead electrode and upper parts of the alignment pins are frictionally held in alignment pin holes in the facing surface of the backing plate.

* * * * *